(12) United States Patent
Yang

(10) Patent No.: US 12,446,183 B2
(45) Date of Patent: Oct. 14, 2025

(54) CHARGE-AND-DISCHARGE TEST APPARATUS AND CONTROL METHOD THEREOF

(71) Applicant: LG ENERGY SOLUTION, LTD., Seoul (KR)

(72) Inventor: Dong Keun Yang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/290,429

(22) PCT Filed: Dec. 9, 2022

(86) PCT No.: PCT/KR2022/020001
§ 371 (c)(1),
(2) Date: Nov. 13, 2023

(87) PCT Pub. No.: WO2023/106876
PCT Pub. Date: Jun. 15, 2023

(65) Prior Publication Data
US 2024/0260224 A1 Aug. 1, 2024

(30) Foreign Application Priority Data
Dec. 9, 2021 (KR) .................... 10-2021-0175786

(51) Int. Cl.
*H05K 7/20* (2006.01)
*H02J 7/00* (2006.01)
*H05K 7/18* (2006.01)

(52) U.S. Cl.
CPC ........ *H05K 7/20145* (2013.01); *H02J 7/0042* (2013.01); *H05K 7/18* (2013.01); *H05K 7/20172* (2013.01); *H05K 7/20209* (2013.01)

(58) Field of Classification Search
CPC .. H05K 7/20145; H05K 7/18; H05K 7/20172; H05K 7/20209; H02J 7/0042;
(Continued)

(56) References Cited

U.S. PATENT DOCUMENTS 10,340,564 B2 * 7/2019 Nishikawa .......... H01M 10/625
11,581,587 B2 2/2023 Cao et al.
(Continued)

FOREIGN PATENT DOCUMENTS

CN 105070950 A 11/2015
JP 2015-87204 A 5/2015
(Continued)

OTHER PUBLICATIONS

Kim Jongwoo; Lim Jina, "Storage box for battery cell", Aug. 13, 2021, First Co. Ltd, Entire Document (Translation of KR 102289714). (Year: 2021).*
(Continued)

*Primary Examiner* — Stephen S Sul
(74) *Attorney, Agent, or Firm* — Birch, Stewart, Kolasch & Birch, LLP

(57) ABSTRACT

A charge-and-discharge test apparatus, and a control method thereof are provided. The charge-and-discharge test apparatus is capable of cooling a power supply configured to supply power to a charger configured to perform a charge-and-discharge test of a battery cell during a battery cell activation process.

13 Claims, 6 Drawing Sheets

(58) Field of Classification Search
CPC .. H02J 7/0069; H02J 7/0013; H01M 10/4285; H01M 10/46; H01M 10/613; H01M 10/6563; H01M 10/667; Y02E 60/10
See application file for complete search history.

(56) References Cited

U.S. PATENT DOCUMENTS

| | | | |
|---|---|---|---|
| 2010/0216004 A1 | 8/2010 | Yoon | |
| 2011/0183179 A1* | 7/2011 | Okada | H01M 50/209 429/120 |
| 2014/0014420 A1* | 1/2014 | Nakamura | H01M 10/647 180/65.1 |
| 2015/0303527 A1* | 10/2015 | Maxwell | H01M 10/6557 429/61 |
| 2016/0093929 A1* | 3/2016 | Obasih | H01M 10/6551 429/120 |
| 2017/0259956 A1* | 9/2017 | Hori | F25B 21/04 |
| 2021/0351470 A1* | 11/2021 | Uemura | B60L 50/64 |

FOREIGN PATENT DOCUMENTS

| | | | |
|---|---|---|---|
| JP | 2017-174533 A | 9/2017 | |
| KR | 20-2010-0011256 U | 11/2010 | |
| KR | 10-1064889 B1 | 9/2011 | |
| KR | 10-2018-0081996 A | 7/2018 | |
| KR | 10-2020-0068951 A | 6/2020 | |
| KR | 10-2119155 B1 | 6/2020 | |
| KR | 10-2021-0079665 A | 6/2021 | |
| KR | 10-2284829 B1 | 8/2021 | |
| KR | 102289714 B1 * | 8/2021 | ............ A62C 37/38 |
| WO | WO 2016/131141 A1 | 8/2016 | |

OTHER PUBLICATIONS

Extended European Search Report for European Application No. 22904705.5, dated Aug. 22, 2024.
International Search Report (PCT/ISA/210) issued in PCT/KR2022/020001, dated Mar. 29, 2023.

* cited by examiner

[Figure 1]
Conventional Art
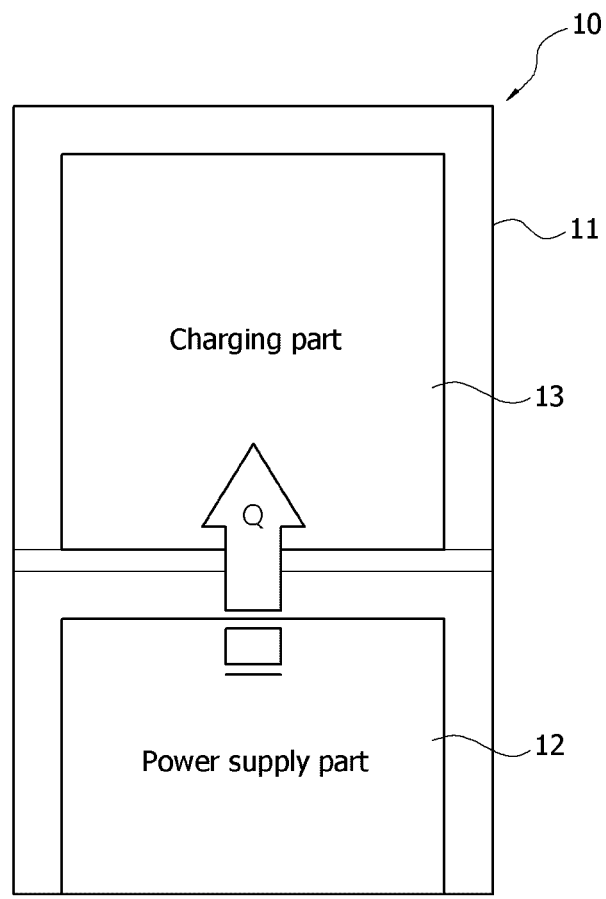

[Figure 2]
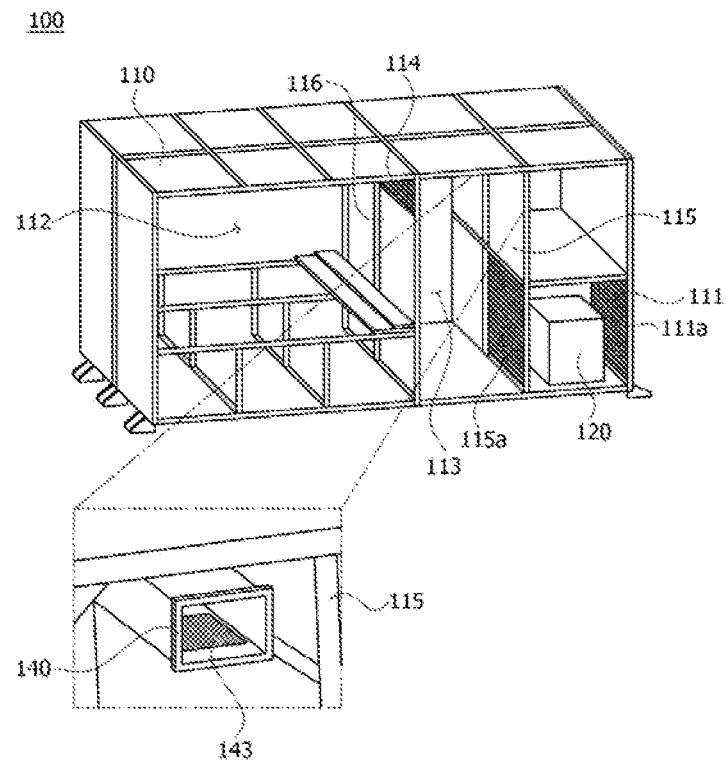
[Figure 3]
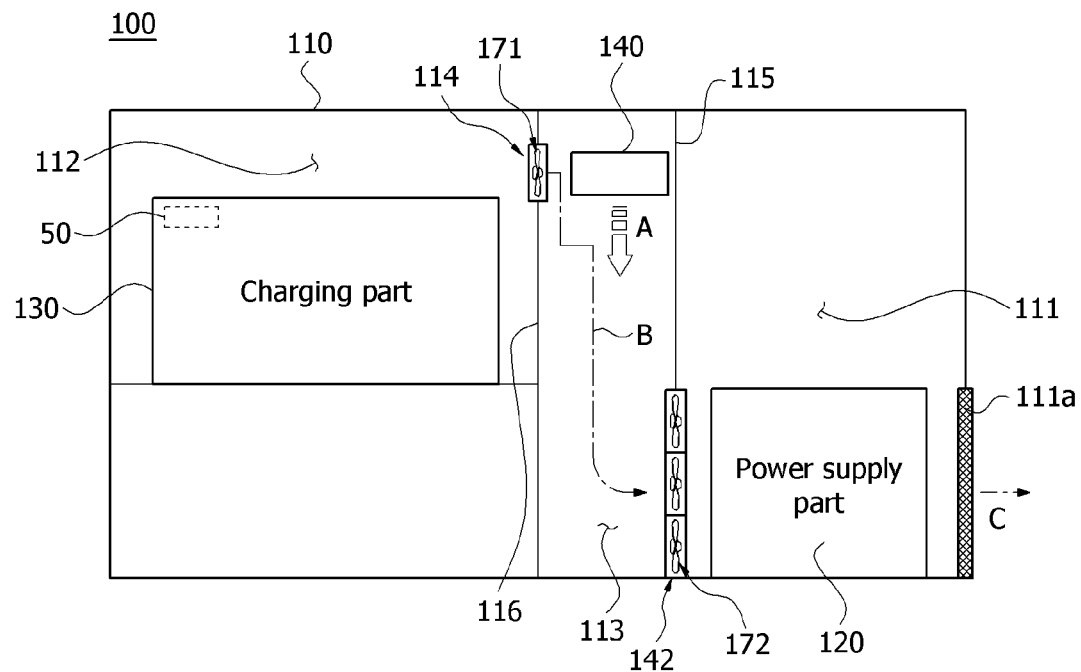

[Figure 4]
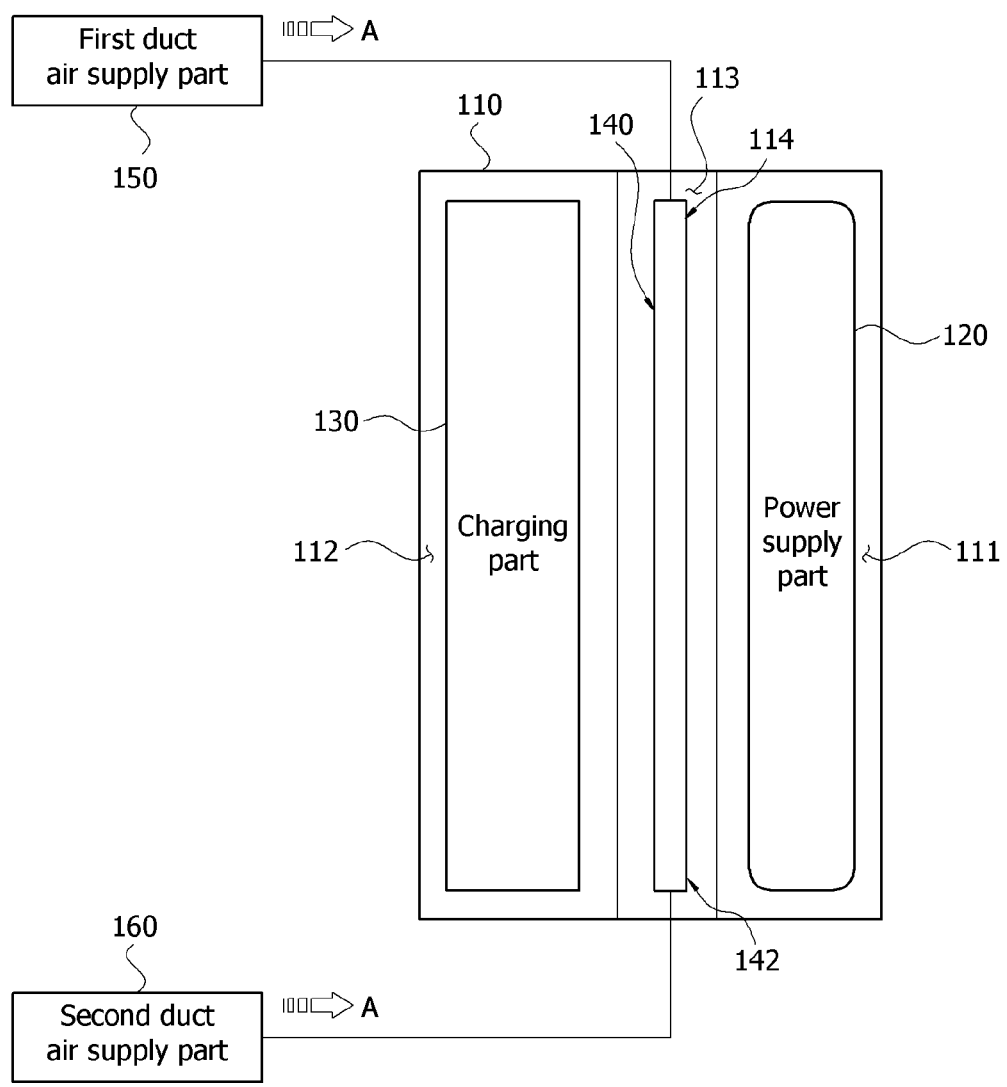

[Figure 5]
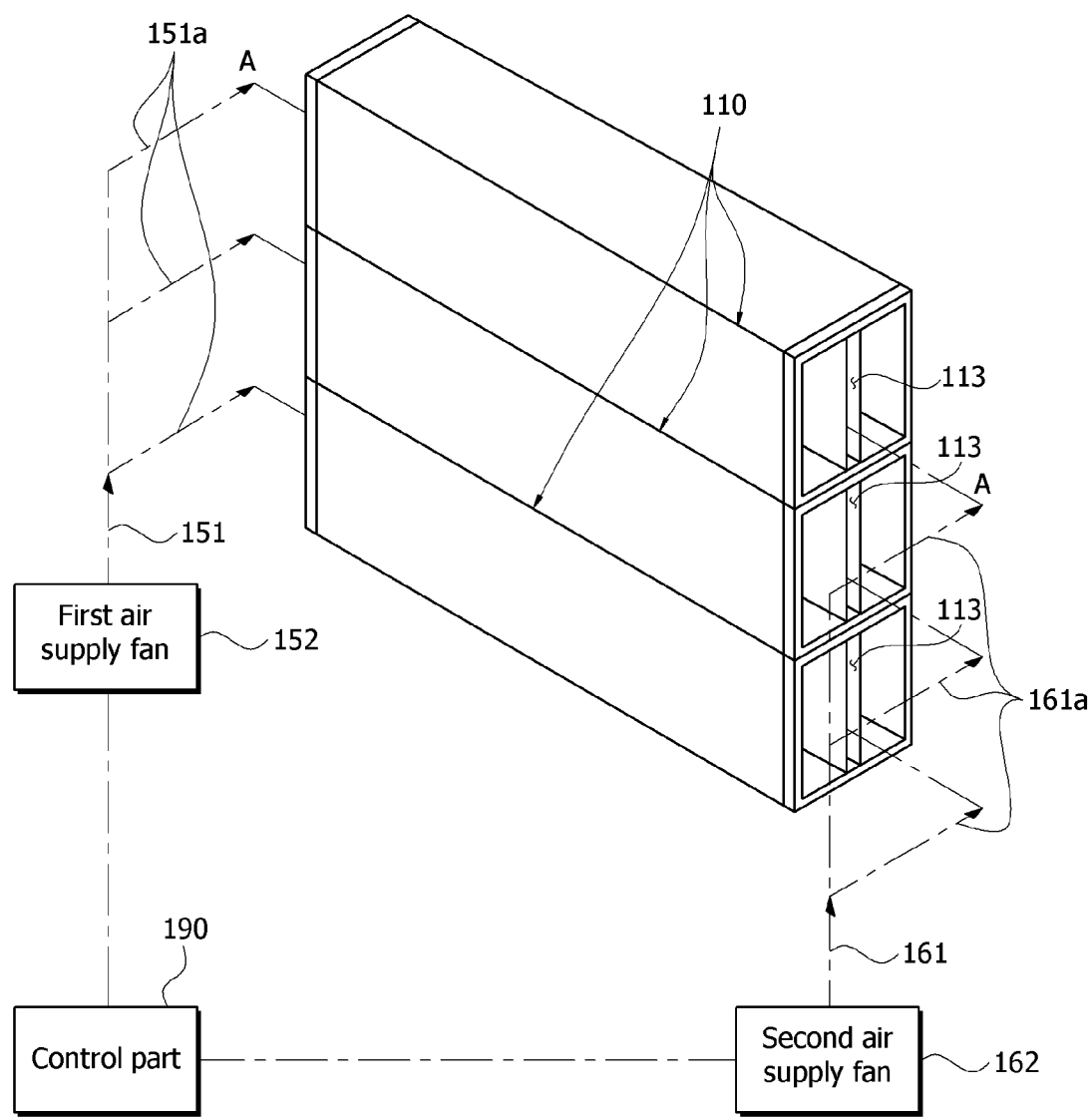

[Figure 6]
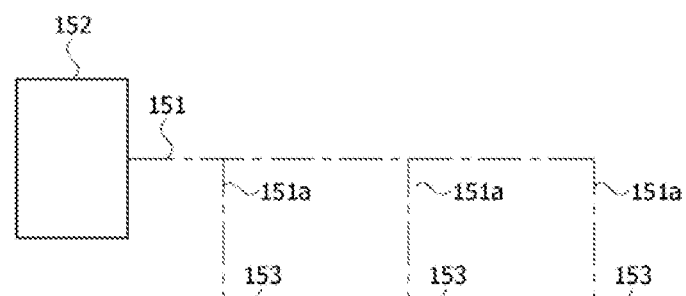
(a)
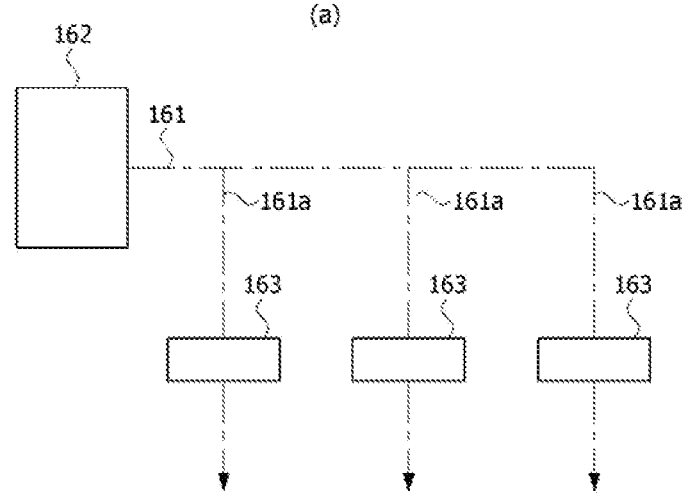
(b)

[Figure 7]
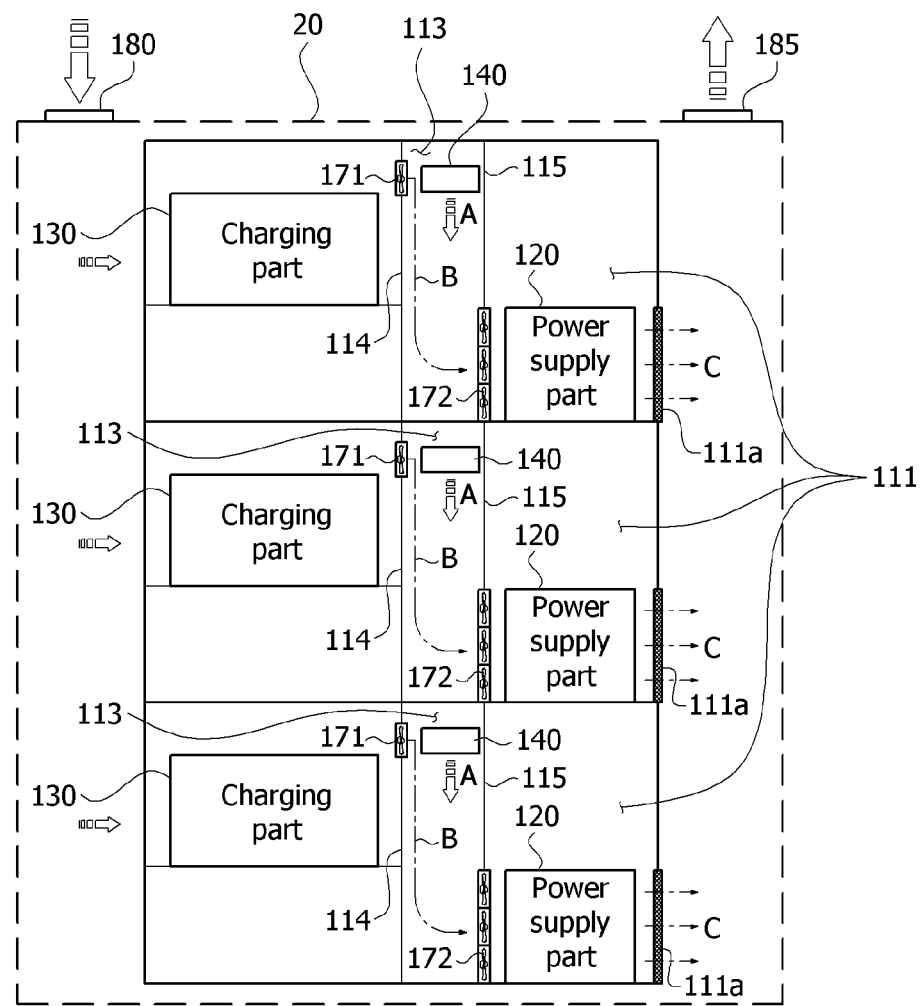

CHARGE-AND-DISCHARGE TEST APPARATUS AND CONTROL METHOD THEREOF

TECHNICAL FIELD

The present invention relates to a charge-and-discharge test apparatus, and a control method thereof, and relates to, in detail, a charge-and-discharge test apparatus capable of cooling a power supply part supplying power to a charging part performing a charge-and-discharge test of a battery cell during a battery cell activation process, and a control method thereof.

The present application claims the benefit of priority based on Korean Patent Application No. 10-2021-0175786 dated Dec. 9, 2021, the disclosure of which is incorporated herein by reference in its entirety.

BACKGROUND ART

FIG. 1 schematically illustrates a configuration diagram of a conventional jig formation device.

The formation process is a process of activating battery cells by repeatedly charging and discharging the battery cells, and removing gas. Upon the formation process of such battery cells, a lot of heat is generated, and in the case of a high-capacity battery cell, the calorific value is further increased.

Referring to FIG. 1, the conventional jig formation device (10) for performing the formation process comprises a device frame (11), a charging part (13), and a power supply part (12).

The device frame (11) is a frame supporting the charging part (13) and the power supply part (12), respectively. The charging part (13) is provided to perform an activation process of a battery cell. In the activation process, the battery cell is charged and discharged through the charging part. The charging part (13) receives power from the power supply part (12). In the conventional jig formation device, the power supply part (12) is installed below the charging part (13).

As the battery cell is manufactured to have a high capacity, the supply current specification of the power supply part increases. In addition, when the capacity of the power supply part increases, the size and calorific value of the power supply part increase together.

In the conventional jig formation device (10), there was a problem that in the battery cell activation process, the heat generated in the power supply part (12) is transferred to the charging part (13).

DISCLOSURE

Technical Problem

The present invention is intended to provide a charge-and-discharge test apparatus capable of effectively cooling a power supply part supplying power to a charging part during a battery cell activation process, and a control method thereof.

Also, the present invention is intended to provide a charge-and-discharge test apparatus having a charging part and a power supply part mounted on a separate space in a frame part, and capable of supplying cooling air to a frame passage located between the charging part and the power supply part, and a control method thereof.

In addition, the present invention is intended to provide a charge-and-discharge test apparatus capable of blocking heat generated from a power supply part from being transferred to a charging part, and a control method thereof.

Furthermore, the present invention is intended to provide a charge-and-discharge test apparatus capable of improving air conditioning efficiency in the apparatus during a battery activation process, and a control method thereof.

Technical Solution

In order to solve the above problems, according to one aspect of the present invention, a charge-and-discharge test apparatus is provided, which comprises a charger configured to charge and discharge battery cells, a power supply configured to supply power to the charger, a frame including a first installation space in which the power supply is located, a second installation space in which the charger is located, a frame passage located between the first installation space and the second installation space, the frame passage including a first partition wall partitioning the frame passage from the first installation space and having a first flow hole, and a second partition wall partitioning the frame passage from the second installation space and having a second flow hole, a cooling duct located in the frame passage and having a supply hole open to the frame passage, at least one duct air supply configured to supply cooling air to the cooling duct, a first blowing fan configured to introduce air in the frame passage into the first installation space through the first flow hole, and a second blowing fan configured to introduce air in the second installation space into the frame passage through the second flow hole.

Also, the frame has a first discharge hole configured to discharge air in the first installation space to outside the frame, which may be provided such that the cooling air introduced into the frame passage through the cooling duct is introduced into the first installation space, and then discharged to the outside of the frame through the first discharge hole.

In addition, it may be provided such that the air introduced into the frame passage from the second installation space through the second flow hole is introduced into the first installation space together with the cooling air supplied from the cooling duct, and then discharged to the outside of the frame through the first discharge hole.

Furthermore, the at least one duct air supply includes a first duct air supply connected to a first end of the cooling duct and a second duct air supply connected to a second end of the cooling duct.

Also, the first duct air supply may comprise a first air supply duct connected to the cooling duct and a first air supply fan located in the first air supply duct, and the second duct air supply may comprise a second air supply duct connected to the cooling duct and a second air supply fan located in the second air supply duct. In this structure, the cooling air may be supplied to both sides of the cooling duct, respectively.

In addition, the first discharge hole may be located to face the first flow hole.

Furthermore, the power supply may be located between the first discharge hole and the first flow hole.

Also, the first flow hole and the second flow hole may be located at different heights relative to a bottom of the frame within the frame.

In addition, the supply hole of the cooling duct may be located at a higher position than the first flow hole in the frame.

Furthermore, the charge-and-discharge test apparatus may comprise a controller configured to control the power supply, the charger, the duct air supply, the first blowing fan, and the second blowing fan.

Also, when the power is supplied to the charger, the controller operates the duct air supply to supply the cooling air to the cooling duct, and operates the first blowing fan and the second blowing fan.

In addition, the charge-and-discharge test apparatus may comprise a power supply room surrounding the frame, the power supply room including a room air supply and a room exhaust.

Furthermore, the power supply room may be configured such that air introduced into the power supply room through the room air supply is introduced into the second installation space of the frame.

In addition, the power supply room may be configured such that air discharged into the power supply room through the first discharge hole of the frame may be discharged to outside of the power supply room by the room exhaust of the power supply room.

According to another aspect of the present invention, as a control method of the charge-and-discharge test apparatus, a method of controlling a charge-and-discharge test apparatus is provided, which comprises applying power to a charger; supplying cooling air to a cooling duct; operating a first blowing fan to supply cooling air in a frame passage into a first installation space; and operating a second blowing fan to discharge the air in the first installation space to the frame passage.

Advantageous Effects

As described above, the charge-and-discharge test apparatus and its control method related to one example of the present invention have the following effects.

During the activation process of the battery cell, it is possible to effectively cool the power supply part supplying power to the charging part.

Also, by disposing the charging part and the power supply part in a separate space within the frame part and supplying cooling air to the frame passage located between the charging part and the power supply part, it is possible to block heat generated in the power supply part from being transferred to the charging part.

In addition, during the battery activation process, it is possible to improve air conditioning efficiency in the apparatus.

DESCRIPTION OF DRAWINGS

FIG. 1 schematically illustrates a configuration diagram of a conventional jig formation device.

FIG. 2 is a perspective diagram showing main constitutions of a charge-and-discharge test apparatus according to one example of the present invention.

FIG. 3 is a front view showing main constitutions of a charge-and-discharge test apparatus according to one example of the present invention.

FIG. 4 is a plan view showing main constitutions of a charge-and-discharge test apparatus according to one example of the present invention.

FIGS. 5 to 7 are diagrams for explaining, in a state where a plurality of frame parts are stacked in a power supply room, flows of cooling air supplied to each frame part.

MODE FOR INVENTION

Hereinafter, a charge-and-discharge test apparatus according to one example of the present invention, and a control method thereof will be described in detail with reference to the accompanying drawings.

The accompanying drawings illustrate exemplary forms of the present invention, which are provided only to explain the present invention in detail, and the technical scope of the present invention is not limited thereto.

In addition, regardless of reference numerals, the same or corresponding components are given with the same reference numerals, and redundant descriptions thereof will be omitted, and for convenience of description, the size and shape of each component member as shown may be exaggerated or reduced.

The terms of first, second, and the like are used for the purpose of distinguishing one component from another.

FIG. 2 is a perspective diagram showing main constitutions of a charge-and-discharge test apparatus (100) according to one example of the present invention, FIG. 3 is a front view showing main constitutions of a charge-and-discharge test apparatus according to one example of the present invention, and FIG. 4 is a plan view showing main constitutions of a charge-and-discharge test apparatus according to one example of the present invention.

The charge-and-discharge test apparatus (100) of the present invention comprises a charging part (130) for charging and discharging a battery cell (50), a power supply part (120) for applying power to the charging part (130), a frame part (110) in which the charging part (130) and the power supply part (120) are each installed, a cooling duct (140), one or more duct air supply parts (150, 160), a first blowing fan (172), and a second blowing fan (171).

Here, the charging part (130) is provided such that it performs the charge and discharge of the battery cell (50), and performs an activation process of the battery cell (50). As one example, the battery cell (50) may be a pouch-type battery cell that a stack cell, in which electrodes and separators are laminated, and an electrolyte are each accommodated in a pouch.

In addition, the power supply part (120) applies power to the charging part (130). The charging part (130) and the power supply part (120) are known devices used in conventional jig formation devices, and detailed descriptions thereof will be omitted.

The frame part (110) has a first installation space (111), a second installation space (112), and a frame passage (113). Specifically, the frame part (110) comprises a first installation space (111) in which the power supply part (120) is disposed, a second installation space (112) in which the charging part (130) is disposed, and a frame passage (113) located between the first installation space (111) and the second installation space (112).

In addition, the frame part (110) comprises a first partition wall (115) partitioning the frame passage (113) and the first installation space (111) and having a first flow hole (115*a*), and a second partition wall (116) partitioning the frame passage (113) and the second installation space (112) and having a second flow hole (114). The first flow hole (115*a*) and the second flow hole (114) may be configured in the form of a mesh through which air may flow.

In this way, through the first partition wall (115) and the second partition wall (116), the internal space of the frame part (110) may be partitioned into the first installation space (111), the second installation space (112), and the frame passage (113) located between the first installation space (111) and the second installation space (112).

The frame passage (113) physically separates the space in which the power supply part (120) and the charging part (130) are disposed, and provides a space capable of blocking heat generated from the power supply part (120) from being transferred to the charging part (130).

The charge-and-discharge test apparatus (100) comprises a cooling duct (140) disposed in the frame passage (113) and having a supply hole (143) open to the frame passage (113), and one or more duct air supply parts (150, 160) provided to supply cooling air (A) to the cooling duct (140).

When the cooling air (A) is supplied to the cooling duct (140) through the duct air supply parts (150, 160), the cooling air (A) may be introduced to the frame passage (113) through the supply hole (143) of the cooling duct (140). In this structure, the cooling air (A) may be supplied into the frame passage (113) between the first installation space (111) and the second installation space (112).

Also, the charge-and-discharge test apparatus (100) comprises a first blowing fan (172) provided to introduce air in the frame passage (113) into the first installation space (111) through the first flow hole (115a), and a second blowing fan (171) provided to introduce air in the second installation space (112) into the frame passage (113) through the second flow hole (114).

In addition, the first blowing fan (172) may be disposed to generate air flow in a direction from the frame passage (113) toward the first installation space (111). Furthermore, the first blowing fan (172) may be mounted on the first partition wall (115) and disposed adjacent to the first flow hole (115a).

Also, the second blowing fan (171) may be disposed to generate air flow in a direction from the second installation space (112) toward the frame passage (113). In addition, the second blowing fan (171) may be mounted on the second partition wall (114) and disposed adjacent to the second flow hole (114).

Also, the frame part (110) has a first discharge hole (111a) for discharging air in the first installation space (111) to the outside. In addition, the first discharge hole (111a) may be positioned to face the first flow hole (115a). Furthermore, the power supply part (120) may be positioned between the first discharge hole (111a) and the first flow hole (115a). In this structure, the air introduced into the first installation space (111) through the first flow hole (115a) may pass through the power supply part (120) to be discharged to the outside of the frame part (110) through the first discharge hole (111a).

Upon operation of the duct air supply parts (150, 160), the cooling air (A) is supplied to the cooling duct (140) through the duct air supply parts (150, 160).

It may be provided such that the cooling air (A) supplied to the frame passage (113) through the supply hole (143) of the cooling duct (140) is introduced into the first installation space (111) through the first flow hole (115a), and then discharged to the outside of the frame part (110) through the first discharge hole (111a).

In addition, it may be provided such that the air (B) introduced into the frame passage (113) from the second installation space (112) through the second flow hole (114a) is introduced into the first installation space (111) through the first flow hole (115a) together with the cooling air (A) supplied from the cooling duct (140), and then discharged to the outside of the frame part through the first discharge hole (111a).

The cooling air (A) introduced into the frame passage (113) flows into the first installation space (111) through the first flow hole (115a) and heat-exchanges in the power supply part (120), and the air (C) heat-exchanged with the power supply part (120) is discharged from the first installation space (111) to the outside of the frame part (110) through the first discharge hole (111a). That is, the air (C) heat-exchanged with the power supply part (120) is discharged to the outside of the frame part (110) without being transferred to the charging part (120).

Also, the first flow hole (115a) and the second flow hole (114) may be positioned at different heights within the frame part (110). The second flow hole (114) may be provided at a higher position than the first flow hole (115a). In addition, the supply hole (143) of the cooling duct (140) may be provided at a higher position than the first flow hole (115a) within the frame part (120). In this structure, the cooling air (A) introduced into the frame passage through the supply hole (143) may fall toward the first flow hole (115a) and then be supplied to the first installation space (111). Furthermore, the air (B) supplied to the frame passage from the second installation space (112) may fall toward the first flow hole (115a) together with the cooling air (A), and then be supplied to the first installation space (111).

In addition, the charge-and-discharge test apparatus (100) may comprise a control part (190) provided to control the power supply part (120), the charging part (130), the duct air supply parts (150, 160), the first blowing fan (172), and the second blowing fan (171).

Furthermore, when the power is applied to the charging part (130), the control part (190) may be provided such that it operates the duct air supply parts (150, 160) to supply the cooling air (A) to the cooling duct (140), and operates the first and second blowing fans (172, 171), respectively.

Referring to FIG. 4, a plurality of duct air supply parts may be provided. In this case, the charge-and-discharge test apparatus (100) may comprise a first duct air supply part (150) connected to one end (141) of the cooling duct (140) and a second duct air supply part (160) connected to the other end (143) of the cooling duct (140). In this structure, the cooling air (A) may be supplied to both sides of the cooling duct (140), respectively.

FIGS. 5 to 7 are diagrams for explaining, in a state where a plurality of frame parts are stacked in a power supply room, flows of cooling air supplied to each frame part.

Referring to FIG. 5, the first duct air supply part (150) may comprise a first air supply duct (151) connected with the cooling duct (140) and a first air supply fan (152) provided in the first air supply duct (151). In addition, the second duct air supply part (160) may comprise a second air supply duct (161) connected with the cooling duct (140) and a second air supply fan (162) provided in the second air supply duct (161).

Referring to FIG. 7, the charge-and-discharge test apparatus (100) may comprise a power supply room (20) surrounding the frame part (110) and including a room air supply part (180) and a room exhaust part (185). In addition, the room air supply part (180) may be provided to supply air into the power supply room (20), and comprise one or more blowing fans, and the room exhaust part (185) may be provided to discharge air to the outside of the power supply room (20), and comprise one or more blowing fans.

Also, it may be provided such that the air introduced into the power supply room (20) through the room air supply part (180) is introduced into the second installation space (112) of the frame part (110). In the frame part (110), a part of the portion forming the second installation space (112) is opened into the power supply room (20).

In this structure, the air introduced into the second installation space (112) is heat-exchanged with the charging part (120), and the air (B) heat-exchanged with the charging part (120) flows into the frame passage (113) by the second blowing fan (17). In addition, through FIG. 3, as described above, the cooling air (A) supplied to the frame passage (113) through the cooling duct (140) flows into the first installation space (111), and then is discharged to the outside of the frame part (110) through the first discharge hole (111a).

Also, referring to FIG. 7, the air (C) discharged into the power supply room (20) through the first discharge hole (111a) of the frame part (110) may be discharged to the outside of the power supply room (20) by the room exhaust part (185) of the power supply room (20).

In addition, the charge-and-discharge test apparatus (100) may comprise a plurality of frame parts (110) inside the power supply room (20). At this time, the charging part (130) and the power supply part (120) are disposed inside each frame part (110).

Referring to FIGS. 5 and 7, the plurality of frame parts (110) may be stacked such that the respective frame passages (113) are arranged in a row along the height direction.

The first and second air supply ducts (151, 161) are each connected to the cooling duct (140), and guide the cooling air (A) to the cooling duct (140). In addition, the first and second air supply fans (152, 162) are provided in the first and second air supply ducts (151, 161), respectively, which are blowing fans such that the cooling air (A) flows to the cooling duct (140) via the first and second air supply ducts (151, 162).

Upon operation of the first air supply fan (152) and the second air supply fan (162), the cooling air (A) is introduced into the cooling duct (140) through the first and second air supply ducts (151, 161), and the cooling air (A) flows from the cooling duct (140) to the first installation space (111) via the frame passage (113), and heat-exchanges with the power supply part (120) in the first installation space (111).

Referring to FIGS. 5 and 6, when the plurality of frame parts (110) is stacked and assembled in the height direction, the first air supply duct (151) and the second air supply duct (161) may be branched into several branches to be connected to the cooling duct (140) of the frame part (110).

To this end, the first and second air supply ducts (151, 161) may each comprise a plurality of air supply branch pipes (151a, 161a). In addition, branch air supply fans (153, 163) may be individually installed in each of the air supply branch pipes (151a, 161a). At this time, the respective branch air supply fans (153, 163) may be operated individually.

According to another example of the present invention, as a control method of the charge-and-discharge test apparatus (100), the control method comprises steps of: applying power to a charging part: supplying cooling air to a cooling duct: operating a first blowing fan to supply cooling air in the frame passage into a first installation space: and operating a second blowing fan to discharge air in the first installation space to the frame passage.

The preferred examples of the present invention as described above have been disclosed for illustrative purposes, and those skilled in the art having ordinary knowledge of the present invention will be able to make various modifications, changes, and additions within the spirit and scope of the present invention, and such modifications and changes and additions are intended to fall within the scope of the following claims.

INDUSTRIAL APPLICABILITY

As described above, according to the charge-and-discharge test apparatus and its control method related to one example of the present invention, by disposing the charging part and the power supply part in a separate space in the frame part, and supplying cooling air to the frame passage located between the charging part and the power supply part, it is possible to block heat generated form the power supply part from being transferred to the charging part.

The invention claimed is:

1. A charge-and-discharge test apparatus comprising:
a charger configured to charge and discharge battery cells;
a power supply configured to supply power to the charger;
a frame including:
   a first installation space in which the power supply is located;
   a second installation space in which the charger is located;
   a frame passage located between the first installation space and the second installation space, the frame passage including:
      a first partition wall partitioning the frame passage from the first installation space, the first partition wall having a first flow hole; and
      a second partition wall partitioning the frame passage from the second installation space, the second partition wall having a second flow hole;
a cooling duct located in the frame passage, the cooling duct having a supply hole open to the frame passage;
at least one duct air supply configured to supply cooling air to the cooling duct;
a first blowing fan configured to introduce air in the frame passage into the first installation space through the first flow hole; and
a second blowing fan configured to introduce air in the second installation space into the frame passage through the second flow hole.

2. The charge-and-discharge test apparatus according to claim 1, wherein the frame has a first discharge hole configured to discharge air in the first installation space outside the frame, and
wherein the cooling air introduced into the frame passage through the cooling duct is introduced into the first installation space, and then discharged to the outside of the frame through the first discharge hole.

3. The charge-and-discharge test apparatus according to claim 2, wherein the air introduced into the frame passage from the second installation space through the second flow hole is introduced into the first installation space together with the cooling air supplied from the cooling duct, and then discharged to the outside of the frame through the first discharge hole.

4. The charge-and-discharge test apparatus according to claim 2, wherein the first discharge hole is located to face the first flow hole.

5. The charge-and-discharge test apparatus according to claim 4, wherein the power supply is located between the first discharge hole and the first flow hole.

6. The charge-and-discharge test apparatus according to claim 2, further comprising a power supply room surrounding the frame, the power supply room including:
a room air supply; and
a room exhaust.

7. The charge-and-discharge test apparatus according to claim 6, wherein the power supply room is configured such that air introduced into the power supply room through the room air supply is introduced into the second installation space of the frame.

8. The charge-and-discharge test apparatus according to claim 7, wherein the power supply room is configured such that air discharged into the power supply room through the first discharge hole of the frame is discharged to outside of the power supply room by the room exhaust of the power supply room.

9. The charge-and-discharge test apparatus according to claim 1, wherein the at least one duct air supply includes:
a first duct air supply connected to a first end of the cooling duct; and
a second duct air supply connected to a second end of the cooling duct,
wherein the first duct air supply includes:
a first air supply duct connected to the cooling duct; and
a first air supply fan located in the first air supply duct, and
wherein the second duct air supply includes:
a second air supply duct connected to the cooling duct; and
a second air supply fan located in the second air supply duct.

10. The charge-and-discharge test apparatus according to claim 1, wherein the first flow hole and the second flow hole are located at different heights relative to a bottom of the frame in the frame.

11. The charge-and-discharge test apparatus according to claim 1, wherein the supply hole of the cooling duct is located at a higher position than the first flow hole in the frame.

12. The charge-and-discharge test apparatus according to claim 1, further comprising a controller configured to control the power supply, the charger, the duct air supply, the first blowing fan, and the second blowing fan,
wherein, when the power is supplied to the charger, the controller operates the duct air supply to supply the cooling air to the cooling duct, and operates the first blowing fan and the second blowing fan.

13. A control method of the charge-and-discharge test apparatus according to claim 1, wherein the control method of the charge-and-discharge test apparatus comprises:
applying power to the charger;
supplying cooling air to the cooling duct;
operating the first blowing fan to supply cooling air in the frame passage into the first installation space; and
operating the second blowing fan to discharge the air in the second installation space to the frame passage.

* * * * *